(12) United States Patent
Goto et al.

(10) Patent No.: US 11,890,831 B2
(45) Date of Patent: Feb. 6, 2024

(54) COMPOSITE MEMBER AND HEAT RADIATION MEMBER

(71) Applicants: Sumitomo Electric Industries, Ltd., Osaka (JP); A.L.M.T. Corp., Tokyo (JP)

(72) Inventors: Kengo Goto, Osaka (JP); Tomoaki Ikeda, Osaka (JP); Akihisa Hosoe, Osaka (JP); Fukuto Ishikawa, Sakata (JP); Masanori Sugisawa, Sakata (JP)

(73) Assignees: Sumitomo Electric Industries, Ltd., Osaka (JP); A.L.M.T. Corp., Tokyo (JP)

( * ) Notice: Subject to any disclaimer, the term of this patent is extended or adjusted under 35 U.S.C. 154(b) by 36 days.

(21) Appl. No.: 17/600,298

(22) PCT Filed: Mar. 5, 2020

(86) PCT No.: PCT/JP2020/009414
§ 371 (c)(1),
(2) Date: Sep. 30, 2021

(87) PCT Pub. No.: WO2020/203014
PCT Pub. Date: Oct. 8, 2020

(65) Prior Publication Data
US 2022/0168995 A1    Jun. 2, 2022

(30) Foreign Application Priority Data
Apr. 2, 2019 (JP) .................. 2019-070853

(51) Int. Cl.
*B32B 15/01* (2006.01)
*C22C 29/06* (2006.01)
(Continued)

(52) U.S. Cl.
CPC ............ *B32B 15/01* (2013.01); *C22C 29/065* (2013.01); *C23C 18/32* (2013.01); *C23C 18/38* (2013.01);
(Continued)

(58) Field of Classification Search
None
See application file for complete search history.

(56) References Cited

U.S. PATENT DOCUMENTS 5,011,708 A    4/1991  Kelly et al.
6,007,925 A *  12/1999  Kakizaki ............... C23C 28/347
                                                          428/428
(Continued)

FOREIGN PATENT DOCUMENTS

CN      1473959 A  *  2/2004
JP      2000-297386 A    10/2000
(Continued)

OTHER PUBLICATIONS

Hu et al., "Deposition behaviour of nickel phosphorus coating on magnesium alloy in a weak corrosive electroless nickel plating bath", Nov. 5, 2015, J. Alloys and Compounds, vol. 658, pp. 555-560. (Year: 2015).*

*Primary Examiner* — Xiaobei Wang
(74) *Attorney, Agent, or Firm* — Faegre Drinker Biddle & Reath LLP

(57) ABSTRACT

A composite member excellent in corrosion resistance of a substrate and excellent in heat radiation property is provided. A composite member includes a substrate composed of a composite material containing magnesium or a magnesium alloy and SiC and a coating layer provided on a surface of the substrate. The coating layer includes an outermost layer provided as an outermost surface and an intermediate layer provided directly under the outermost layer. The outermost layer contains nickel and phosphorus. The intermediate layer is mainly composed of copper. The intermediate layer has a thickness not smaller than 30 μm.

7 Claims, 2 Drawing Sheets

(51) Int. Cl.
*C23C 18/32* (2006.01)
*C23C 18/38* (2006.01)
*C25D 3/38* (2006.01)

(52) U.S. Cl.
CPC ......... *C25D 3/38* (2013.01); *Y10T 428/12576* (2015.01)

(56) References Cited

U.S. PATENT DOCUMENTS

| | | | | |
|---|---|---|---|---|
| 6,068,938 A | * | 5/2000 | Kato | C25D 5/42 |
| | | | | 428/656 |
| 2003/0096059 A1 | | 5/2003 | Suzuki et al. | |
| 2005/0048309 A1 | * | 3/2005 | Haketa | B32B 15/018 |
| | | | | 428/929 |
| 2011/0229733 A1 | * | 9/2011 | Numano | C22C 23/02 |
| | | | | 428/649 |
| 2014/0182824 A1 | | 7/2014 | Hirotsuru et al. | |

FOREIGN PATENT DOCUMENTS

| | | |
|---|---|---|
| JP | 2001-089881 A | 4/2001 |
| JP | 2002-206170 A | 7/2002 |
| JP | 2002-212782 A | 7/2002 |
| JP | 2003-155575 A | 5/2003 |
| JP | 2012-144767 A | 8/2012 |
| JP | 2014-1439 A | 1/2014 |
| JP | 2014-062329 A | 4/2014 |
| JP | 2016-065153 A | 4/2016 |
| JP | 2017-112277 A | 6/2017 |
| JP | 2018-003105 A | 1/2018 |
| JP | 2018526531 A | 9/2018 |
| WO | WO-2017005985 A1 | 1/2017 |

* cited by examiner

COMPOSITE MEMBER AND HEAT RADIATION MEMBER

TECHNICAL FIELD

The present disclosure relates to a composite member and a heat radiation member. The present application claims priority to Japanese Patent Application No. 2019-070853 filed on Apr. 2, 2019, the entire contents of which are herein incorporated by reference.

BACKGROUND ART

A composite member in Japanese Patent Laying-Open No. 2012-144767 (PTL 1) includes a substrate composed of a composite material and a metal coating layer that covers a surface of the substrate. The composite material is a composite of magnesium or a magnesium alloy and SiC. The metal coating layer includes an underlying layer, a zinc layer, a copper plated layer, and a nickel plated layer sequentially from a substrate side.

CITATION LIST

Patent Literature

PTL 1: Japanese Patent Laying-Open No. 2012-144767

SUMMARY OF INVENTION

A composite member according to the present disclosure includes a substrate composed of a composite material containing pure magnesium or a magnesium alloy and SiC and a coating layer provided on a surface of the substrate, the coating layer including an outermost layer provided as an outermost surface and an intermediate layer provided directly under the outermost layer, the outermost layer containing nickel and phosphorus, the intermediate layer being mainly composed of copper, and the intermediate layer having a thickness not smaller than 30 μm.

A heat radiation member according to the present disclosure is made from the composite member according to the present disclosure.

DETAILED DESCRIPTION

Figure 1:
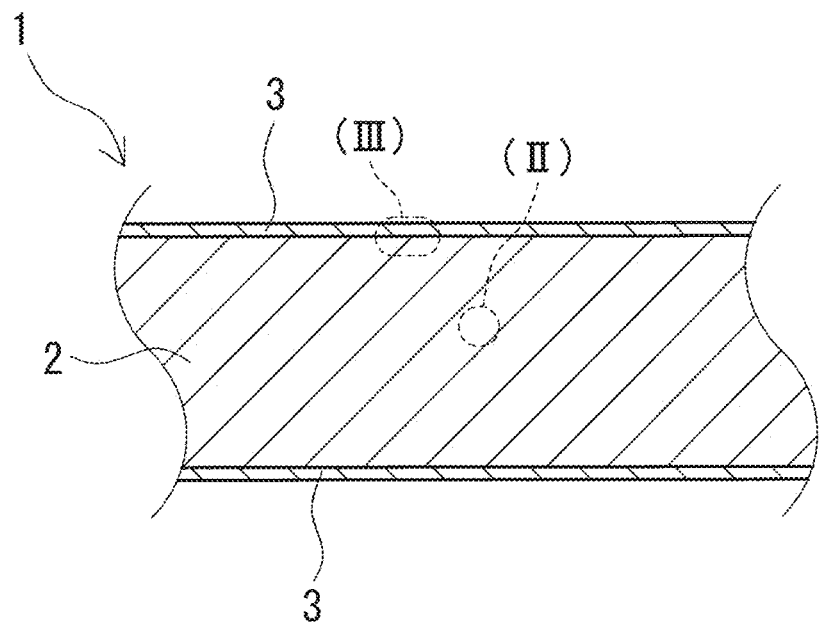
FIG. 1 is a cross-sectional view showing overview of a composite member according to a first embodiment.

Problem to be Solved by the Present Disclosure

Development of a composite member excellent in corrosion resistance of a substrate and excellent in heat radiation property has been demanded.

Then, one of objects of the present disclosure is to provide a composite member excellent in corrosion resistance of a substrate and excellent in heat radiation property. Another one of the objects of the present disclosure is to provide a heat radiation member excellent in corrosion resistance of a substrate and excellent in heat radiation property.

Advantageous Effect of the Present Disclosure

The composite member according to the present disclosure and the heat radiation member according to the present disclosure are excellent in corrosion resistance of the substrate and excellent in heat radiation property.

DESCRIPTION OF EMBODIMENTS OF THE PRESENT DISCLOSURE

The present inventors have studied about corrosion resistance of the substrate in the composite member described above including the outermost layer composed of nickel and the intermediate layer provided directly under the outermost layer and composed of copper. In general, nickel tends to more readily be ionized than copper. Therefore, the present inventors have expected that results below will be obtained in a corrosive environment such as a salt water environment: The outermost layer composed of nickel rather than the intermediate layer composed of copper will be a sacrificial layer that is preferentially corroded; and consequently, the conventional composite member can achieve suppressed corrosion of the intermediate layer and suppressed corrosion of the substrate.

In the corrosive environment, however, the substrate was corroded. The present inventors have conducted dedicated studies about a cause thereof, and obtained findings below. In the corrosive environment, relation between nickel and copper in terms of strength of tendency toward ionization is reverse. Specifically, in the corrosive environment, copper tends to more readily be ionized than nickel. Therefore, the intermediate layer rather than the outermost layer is corroded. When the outermost layer is composed of nickel, suppression of corrosion of the substrate is less likely in spite of a large thickness of the intermediate layer.

Then, the present inventors have further conducted dedicated studies about a construction of a coating layer and obtained findings below. Corrosion resistance of the substrate can be improved by providing an outermost layer containing phosphorus in addition to nickel and increasing a thickness of the intermediate layer provided directly under the outermost layer and mainly composed of copper. The present invention is based on these findings. Embodiments of the present disclosure will initially be listed and described.

(1) A composite member according to one manner of the present disclosure includes a substrate composed of a composite material containing pure magnesium or a magnesium alloy and SiC and a coating layer provided on a surface of the substrate, the coating layer including an outermost layer provided as an outermost surface and an intermediate layer provided directly under the outermost layer, the outermost layer containing nickel and phosphorus, the intermediate layer being mainly composed of copper, and the intermediate layer having a thickness not smaller than 30 μm.

The construction above is excellent in corrosion resistance of the substrate because the outermost layer provided directly on the intermediate layer mainly composed of copper contains phosphorus in addition to nickel and additionally the intermediate layer is sufficiently large in thickness. The outermost layer contains phosphorus in addition to nickel. Therefore, even when the intermediate layer mainly composed of copper is provided directly under the outermost layer, relation between constituent materials of the outermost layer and the intermediate layer in terms of tendency toward ionization is not reverse even in the corrosive environment. In other words, the constituent material of the outermost layer is stronger in tendency toward ionization than the constituent material of the intermediate layer. Therefore, even in the corrosive environment, the outermost layer rather than the intermediate layer serves as a sacrificial layer that is preferentially corroded. Therefore, corrosion of the intermediate layer is suppressed. Corrosion of the intermediate layer is thus suppressed and additionally corrosion of the substrate is suppressed because the intermediate layer is sufficiently large in thickness.

The construction above is excellent in heat radiation property because the intermediate layer mainly composed of copper high in thermal conductivity is sufficiently large in thickness. Therefore, the construction above can suitably be made use of for a heat radiation member.

Furthermore, the construction above is excellent in adhesion to solder because the outermost layer contains nickel that provides excellent affinity for solder. Therefore, the construction above is excellent in adhesion to a target member joined by solder such as a semiconductor element of a semiconductor device or an insulating substrate on which a semiconductor element is mounted.

(2) In one form of the composite member, the coating layer may include an inner layer provided directly under the intermediate layer and the inner layer may contain nickel and phosphorus.

The construction above achieves enhanced adhesion between the substrate and the coating layer because the inner layer has good affinity for any of the substrate and the intermediate layer by containing nickel and phosphorus.

(3) In one form of the composite member, the intermediate layer may have a thickness not larger than 200 µm.

According to the construction, increase in coefficient of thermal expansion, increase in weight, and lowering in productivity are readily suppressed, because the thickness of the intermediate layer is not excessively large. Since the construction above is thus not only excellent in heat radiation property as described above but also achieves suppressed increase in coefficient of thermal expansion, it can more suitably be made use of for a heat radiation member. In particular, since the construction above is excellent also in adhesion to solder as described above, it is suitable for a heat radiation member of a target member joined by solder. This is because increase in coefficient of thermal expansion is suppressed, and hence, in spite of being subjected to heat cycles, the target member is less likely to peel off from the composite member due to thermal contraction and expansion.

(4) A heat radiation member according to one form of the present disclosure is made from the composite member described in any one of (1) to (3).

The construction above is excellent in heat radiation property because it is made from the composite member excellent in heat radiation property. In particular, the construction above tends to efficiently radiate heat from a target member joined by solder because it is made from the composite member excellent in adhesion to solder. The construction above can suitably be made use of also in a corrosive environment because it is made from the composite member including the substrate excellent in corrosion resistance.

Details of Embodiments of the Present Disclosure

Details of embodiments of the present disclosure will be described below. The same elements in the drawings have the same references allotted.

First Embodiment

[Composite Member]

Figure 2:
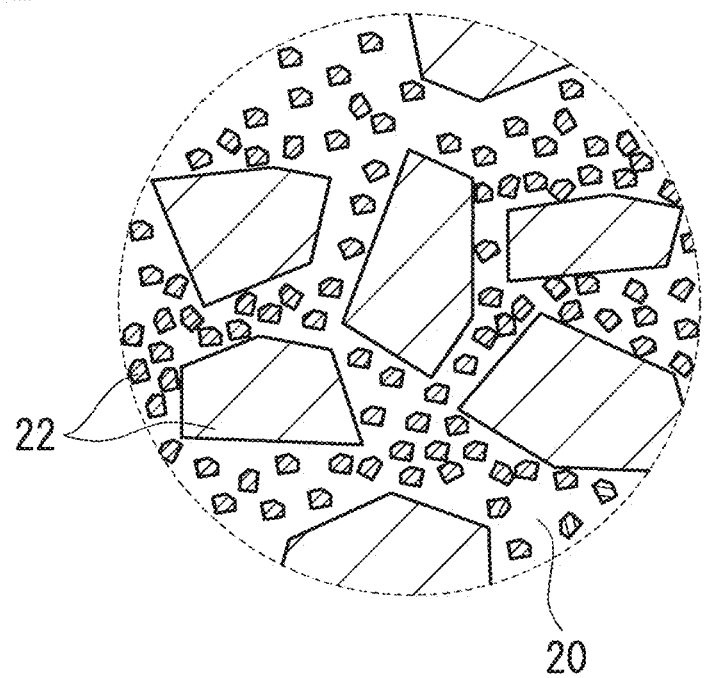
FIG. 2 is an illustrative view showing overview of a structure of a substrate included in the composite member according to the first embodiment.
Figure 3:
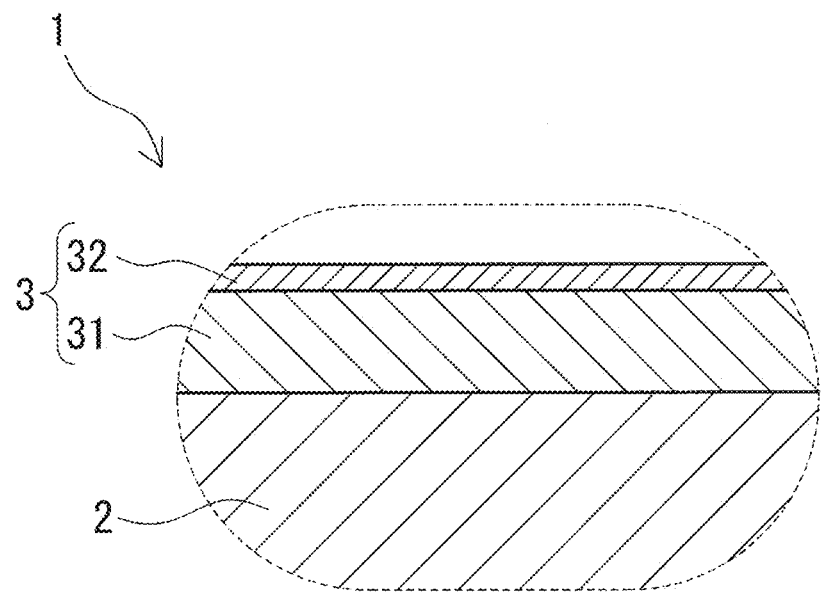
FIG. 3 is a cross-sectional view showing overview of a coating layer included in the composite member according to the first embodiment.

A composite member 1 in a first embodiment will be described with reference to FIGS. 1 to 3. Composite member 1 in the present form includes a substrate 2 and a coating layer 3. Substrate 2 is composed of a composite material containing pure magnesium (Mg) or an Mg alloy and silicon carbide (SiC). Coating layer 3 is provided on a surface of substrate 2. One of characteristics of composite member 1 in the present form resides in that coating layer 3 includes a specific outermost layer 32 provided as an outermost surface and a specific intermediate layer 31 provided directly under outermost layer 32 (FIG. 3). Each feature will be described in detail below. FIG. 2 shows as being enlarged, an area surrounded by a dashed circle shown on substrate 2 in FIG. 1. FIG. 3 shows as being enlarged, an area surrounded by a dashed oval shown around a boundary between substrate 2 and coating layer 3 in FIG. 1.

[Substrate]

Substrate 2 is composed of a composite material containing a metal 20 and a non-metal 22 (FIG. 2). A known substrate can be employed as substrate 2.

(Metal)

Metal 20 is composed of pure Mg or an Mg alloy. Pure Mg contains at least 99.8 mass % of Mg and an inevitable impurity as the remainder. The Mg alloy contains an additive element and is composed of Mg and an inevitable impurity as the remainder. For example, the additive element may be at least one type of an element selected from the group consisting of lithium (Li), silver (Ag), nickel (Ni), calcium (Ca), aluminum (Al), zinc (Zn), manganese (Mn), silicon (Si), copper (Cu), zirconium (Zr), beryllium (Be), strontium (Sr), yttrium (Y), tin (Sn), cerium (Ce), and a rare earth element (except for Y and Ce). A total content of these elements is preferably not higher than 20 mass % with the entire Mg alloy being defined as 100 mass %. Since substrate 2 in which the total content is not higher than 20 mass % is not excessive in content of the additive element, it can achieve suppressed lowering in thermal conductivity. A known standard alloy can be employed for the Mg alloy. Substrate 2 in which metal 20 is composed of pure Mg tends to be higher in thermal conductivity than substrate 2 in which metal 20 is composed of the Mg alloy. Substrate 2 in which metal 20 is composed of the Mg alloy tends to be higher in corrosion resistance or the like than substrate 2 in which metal 20 is composed of pure Mg.

(Non-Metal)

Non-metal 22 is composed of SiC. SiC is high in thermal conductivity. Therefore, this substrate 2 can suitably be made use of for the heat radiation member. SiC is smaller in coefficient of thermal expansion than Mg. Therefore, this substrate 2 is excellent in compatibility in coefficient of thermal expansion with a target member such as a semiconductor element of a semiconductor device (not shown) or an insulating substrate on which a semiconductor element is mounted. Therefore, this substrate 2 is suitable for a heat radiation member of a semiconductor element or the like.

<Form of Presence>

A state of presence of non-metal 22 representatively includes a powdery form or a networked form. In the powdery form, non-metal 22 is present as powder particles in a matrix of metal 20. The networked form refers to such a form that pieces of non-metal 22 are coupled to each other by a networking portion and a gap between pieces of non-metal 22 is filled with metal 20. Non-metal 22 in substrate 2 is representatively present with a composition, a shape, or a size thereof in its state as a source material substantially being maintained. When SiC powders are employed as the source material, the state of presence of non-metal 22 falls under the powdery form. Alternatively, when a formed material such as a networked SiC porous body is employed as the source material, the state of presence of non-metal 22 falls under the networked form.

<Content>

A content of SiC in substrate 2 is preferably not lower than 50 volume % with substrate 2 being defined as 100 volume %. As the content of SiC is not lower than 50 volume %, thermal conductivity tends to be high and additionally the coefficient of thermal expansion tends to be small. As the content of SiC in substrate 2 is higher, thermal conductivity of substrate 2 tends to be higher and additionally the coefficient of thermal expansion of substrate 2 tends to be smaller. The content of SiC in substrate 2 is further preferably not lower than 60 volume % and particularly preferably not lower than 65 volume %. The content of SiC in substrate 2 is, for example, preferably not higher than 90 volume % because manufacturability of substrate 2 is excellent when the content of SiC is not higher than 90 volume %. The content of SiC in substrate 2 is further preferably not higher than 85 volume %.

(Others)

Substrate 2 can contain a non-metal below in addition to SiC. The substrate may contain, for example, at least one type of a non-metal selected from among $Si_3N_4$, Si, MgO, $Mg_2Si$, $MgB_2$, $Al_2O_3$, AlN, $SiO_2$, diamond, and graphite. These non-metals are smaller in coefficient of thermal expansion than Mg, high in heat conduction, and less likely to react with Mg.

(Two-Dimensional Shape)

A two-dimensional shape of substrate 2 is not particularly limited, and can be selected as appropriate depending on an application of composite member 1. Substrate 2 may representatively be in a rectangular two-dimensional shape. In addition, substrate 2 may be in a circular two-dimensional shape, an oval two-dimensional shape, or various polygonal shapes other than the rectangular shape.

(Thickness)

A thickness of substrate 2 is not particularly limited, and can be selected as appropriate depending on an application of composite member 1. When composite member 1 is employed, for example, for a heat radiation member of a semiconductor element or the like, substrate 2 may have a thickness, for example, not larger than 10 mm and furthermore not larger than 6 mm.

[Coating Layer]

Coating layer 3 is provided on a surface of substrate 2 (FIG. 1). An area covered with coating layer 3 can be selected as appropriate depending on an application of composite member 1. When composite member 1 is made use of for a heat radiation member of a semiconductor element or the like, one of a pair of opposing surfaces of substrate 2 serves as a mount surface on which a semiconductor element is mounted. The other surface serves as a cooling surface in contact with a cooling apparatus. Normally, solder is applied to the mount surface. Therefore, at least an area of the mount surface to which solder is applied may be covered with coating layer 3. The entire area of the mount surface of substrate 2, the entire area of the mount surface and the cooling surface of substrate 2, or the entire area of surfaces of substrate 2 may be covered with coating layer 3. In the present form, coating layer 3 is in a two-layered structure of an intermediate layer 31 and an outermost layer 32 sequentially from a side of substrate 2 (FIG. 3). A thickness of intermediate layer 31 and a thickness of outermost layer 32 in FIG. 3 are schematically shown and do not necessarily correspond to an actual thickness.

(Intermediate Layer)

Intermediate layer 31 is provided directly under outermost layer 32. In the present form, intermediate layer 31 is provided directly on substrate 2.

Intermediate layer 31 is mainly composed of Cu. Being mainly composed of Cu means that, with all constituent elements of intermediate layer 31 being defined as 100 mass %, a content of Cu satisfies 98.0 mass % or higher. The content of Cu in intermediate layer 31 is further preferably 99.0 mass % or higher and particularly preferably 99.5 mass % or higher. Intermediate layer 31 may be composed substantially only of Cu. Being composed substantially only of Cu means that an inevitable impurity other than Cu may be contained. The composition of and the content in intermediate layer 31 are found by energy dispersive X-ray analysis (EDX).

Intermediate layer 31 may have a thickness not smaller than 30 μm. Composite member 1 in which intermediate layer 31 has a thickness not smaller than 30 μm is excellent in corrosion resistance of substrate 2 and excellent in heat radiation property, because intermediate layer 31 is sufficiently large in thickness. Intermediate layer 31 has a thickness preferably not larger than 200 μm. Composite member 1 in which intermediate layer 31 has a thickness not larger than 200 μm tends to achieve suppressed increase in coefficient of thermal expansion, suppressed increase in weight, and suppressed lowering in productivity, because intermediate layer 31 is not excessively large in thickness. Since this composite member 1 is excellent in heat radiation property and additionally can achieve suppressed increase in coefficient of thermal expansion, it is suitable for a heat radiation member. Intermediate layer 31 has a thickness further preferably not smaller than 50 μm and not larger than 150 and particularly preferably not smaller than 80 μm and not larger than 100 μm. How to find a thickness of intermediate layer 31 will be described later.

(Outermost Layer)

Outermost layer 32 is provided as the outermost surface of coating layer 3. Outermost layer 32 is provided directly on intermediate layer 31. Outermost layer 32 contains Ni and phosphorus (P). Since outermost layer 32 containing Ni is excellent in affinity for solder, it is excellent in adhesion to solder. Therefore, outermost layer 32 is excellent in adhesion to a target member such as a semiconductor element joined by solder. Even when intermediate layer 31 is provided directly under outermost layer 32 containing P in addition to Ni, outermost layer 32 performs a function as a sacrificial layer that is preferentially corroded also in a corrosive environment. Therefore, outermost layer 32 can suppress corrosion of intermediate layer 31. Therefore, outermost layer 32 can suppress corrosion of substrate 2.

A content of Ni in outermost layer 32 may be not lower than 87 mass % and not higher than 99 mass % with all constituent elements of outermost layer 32 being defined as 100 mass %. A content of P in outermost layer 32 may be not lower than 1 mass % and not higher than 13 mass % with all constituent elements of outermost layer 32 being defined as 100 mass %. As the content of P is lower, outermost layer 32 is better in adhesion to solder. As the content of P is higher, outermost layer 32 is better in corrosion resistance. The content of P in outermost layer 32 is desirably selected as appropriate within the range above, depending on a desired characteristic. Outermost layer 32 may be composed substantially only of Ni and P. Being composed substantially only of Ni and P means that an inevitable impurity other than Ni and P may be contained. The composition of and the content in outermost layer 32 are found by EDX, as in intermediate layer 31 described above.

Outermost layer 32 has a thickness, for example, preferably not smaller than 0.1 μm and not larger than 6.0 μm. Composite member 1 in which outermost layer 32 has a thickness not smaller than 0.1 μm is excellent in corrosion resistance of substrate 2 and adhesion to solder, because outermost layer 32 is sufficiently large in thickness. Composite member 1 in which outermost layer 32 has a thickness not larger than 6.0 μm tends to achieve suppressed increase in coefficient of thermal expansion, suppressed lowering in thermal conductivity, and suppressed lowering in productivity. Outermost layer 32 has a thickness further preferably not smaller than 1.5 μm and not larger than 5.0 μm and particularly preferably not smaller than 2.0 μm and not larger than 4.0 μm. How to find a thickness of outermost layer 32 will be described later.

[Manufacturing Method]

Composite member 1 in the present form can be manufactured by forming intermediate layer 31 and outermost layer 32 on the surface of substrate 2 sequentially from the side of substrate 2. Substrate 2 may be prepared by manufacturing by an infiltration method, a pressure infiltration method, powder metallurgy, and a melting method that have been known, or may be prepared by purchasing a commercially available substrate. Intermediate layer 31 may be formed by direct plating. In direct plating, the intermediate layer is formed by attaching a catalyst to substrate 2. Examples of the catalyst include palladium and carbon. In addition, intermediate layer 31 can be formed by Cu electroplating after Cu electroless plating. Alternatively, intermediate layer 31 can be formed by Cu electroplating after sputtering of Cu. Outermost layer 32 can be formed by plating. Examples of plating include electroplating and electroless plating.

[Functions and Effects]

Composite member 1 in the present form is excellent in corrosion resistance and heat radiation property of substrate 2. Therefore, composite member 1 in the present form can suitably be made use of for a heat radiation member used in a corrosive environment. Furthermore, composite member 1 in the present form is excellent in adhesion to solder and excellent in compatibility in coefficient of thermal expansion with a semiconductor or the like. Therefore, composite member 1 in the present form is suitable for a heat radiation member of a semiconductor element or the like joined by solder.

Second Embodiment

[Composite Member]

Figure 4:
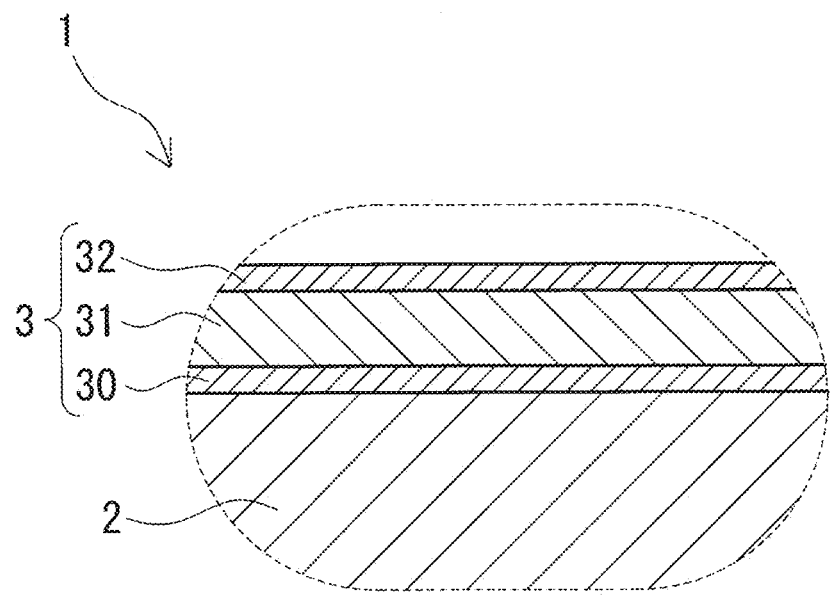
FIG. 4 is a cross-sectional view showing overview of the coating layer included in the composite member according to a second embodiment.

Composite member 1 in a second embodiment will be described with reference to FIG. 4. Composite member 1 in the present form is different from composite member 1 in the first embodiment in that coating layer 3 includes a specific inner layer 30 directly under intermediate layer 31. Specifically, coating layer 3 is in a three-layered structure including inner layer 30, intermediate layer 31, and outermost layer 32 sequentially from the side of substrate 2. FIG. 4 is a cross-sectional view showing as being enlarged, a position the same as in the cross-sectional view shown in FIG. 3. Description will be given below with a difference from the first embodiment being focused on. Description of features the same as in the first embodiment will not be provided.

[Coating Layer]

(Inner Layer)

Inner layer 30 is provided directly under intermediate layer 31. In the present form, inner layer 30 is provided directly on substrate 2.

Inner layer 30 contains Ni and P. Inner layer 30 containing Ni and P is excellent in adhesion to substrate 2 and intermediate layer 31. A content of Ni in inner layer 30 may be within a range the same as that in outermost layer 32 described above. Similarly, a content of P in inner layer 30 may be within a range the same as in outermost layer 32 described above. Inner layer 30 may be composed substantially only of Ni and P. Being composed substantially only of Ni and P means that an inevitable impurity other than Ni and P may be contained. The content of Ni and P in inner layer 30 may be identical to or different from the content thereof in outermost layer 32. A material for inner layer 30 is found by EDX, similarly to intermediate layer 31 and the like described above.

Inner layer 30 has a thickness, for example, preferably not smaller than 3.0 μm and not larger than 20.0 μm. Composite member 1 in which inner layer 30 has a thickness not smaller than 3.0 μm is excellent in corrosion resistance of substrate 2, because inner layer 30 is sufficiently large in thickness. Composite member 1 in which inner layer 30 has a thickness not larger than 20.0 μm tends to achieve suppressed increase in coefficient of thermal expansion or suppressed lowering in thermal conductivity of composite member 1. Inner layer 30 has a thickness further preferably not smaller than 4.0 μm and not larger than 15.0 μm and particularly preferably not smaller than 6.0 μm and not larger than 12.0 μm. Inner layer 30 may be identical to or different from outermost layer 32 in thickness. How to find a thickness of inner layer 30 will be described later.

[Manufacturing Method]

Composite member 1 in the present form can be manufactured by forming inner layer 30, intermediate layer 31, and outermost layer 32 on the surface of substrate 2 sequentially from the side of substrate 2. Substrate 2 is prepared as described above. Inner layer 30 can be formed by plating or the like, as in formation of outermost layer 32 described above. Intermediate layer 31 and outermost layer 32 are formed as described above.

[Functions and Effects]

Composite member 1 in the present form can achieve effects similar to those of composite member 1 in the first embodiment. In addition, composite member 1 in the present form is better in adhesion to substrate 2 and coating layer 3 than composite member 1 in the first embodiment, because coating layer 3 includes inner layer 30.

EXAMPLE

The present embodiment will further specifically be described with reference to Example. Example does not limit the present embodiment.

Test Example 1

Composite members having various coating layers formed on the surfaces of the substrates were made, and corrosion resistance of the substrate in each composite member and the coefficient of thermal expansion (ppm/K) and thermal conductivity (W/m·K) of the composite member were examined. A substrate composed of a composite material containing pure Mg and SiC was employed as the substrate. A content of SiC in the substrate was 70 volume %. The substrate had a thickness of 5 mm.

[Samples Nos. 1 to 4]

The composite member in each of samples Nos. 1 to 4 was made by forming a coating layer in the two-layered structure including a first layer and a second layer directly on the substrate sequentially from the side of the substrate. In other words, the second layer was the outermost layer. The first layer was the layer provided directly under the outermost layer. A Cu plated layer composed substantially only of Cu was formed as the first layer. The first layer was formed by direct plating. In direct plating, palladium was employed as powders of a catalyst to be attached to the substrate. The thickness of the first layer was varied by variously changing a time period for treatment. An Ni—P plated layer composed substantially only of Ni and P was formed as the second layer. The second layer was formed by electroless plating. Top Nicoron LPH-LF manufactured by Okuno Chemical Industries Co., Ltd. was employed as a plating solution for electroless plating. A temperature of the plating solution was set to 85° C. The time period for treatment was set to 15 minutes. A concentration of P in the second layer was 2 mass %. The concentration of P was found by EDX as described above.

[Samples Nos. 5 and 6]

The composite member of each of samples Nos. 5 and 6 was made similarly to sample No. 2 except for difference in content of P in the second layer. In other words, in the composite member of each of samples Nos. 5 and 6, the second layer was the outermost layer. In the composite member of each of samples Nos. 5 and 6, the first layer was the layer provided directly under the outermost layer. Samples Nos. 5 and 6 were different from sample No. 2 in type of a plating solution for electroless plating used for forming the second layer, temperature of the plating solution, and time period for treatment. Specifically, for sample No. 5, ICP Nicoron GM (NP) manufactured by Okuno Chemical Industries Co., Ltd. was employed as the plating solution. The temperature of the plating solution was set to 80° C. The time period for treatment was set to 13 minutes. For sample No. 6, Top Nicoron SA-98-LF manufactured by Okuno Chemical Industries Co., Ltd. was employed as a plating solution. The temperature of the plating solution was set to 90° C. The time period for treatment was set to 13 minutes. A concentration of P in the second layer of the composite member of sample No. 5 was 6 mass %. A concentration of P in the second layer of the composite member of sample No. 6 was 11 mass %. The concentration of P in each second layer was found by EDX as described above.

[Samples Nos. 7 to 10]

The composite member of each of samples Nos. 7 to 10 was made by forming a coating layer in the three-layered structure including the first layer, the second layer, and a third layer directly on the substrate sequentially from the side of the substrate. In other words, the third layer was the outermost layer. The second layer was the layer provided directly under the outermost layer. The first layer was the layer provided directly under the second layer. The first layer and the third layer were each made from an Ni—P plated layer (in which the content of P was 2 mass %) composed substantially only of Ni and P, similarly to the second layer of sample No. 1. The first layer and the third layer were different from each other in thickness by changing the time period for treatment. The second layer was formed from a Cu plated layer composed substantially only of Cu, similarly to the first layer of sample No. 1 and the like.

[Samples Nos. 101 and 102]

The composite member of sample No. 101 was made similarly to sample No. 1 except for a difference in thickness of the first layer. In the composite member of sample No. 101, the second layer was the outermost layer. In the composite member of sample No. 101, the first layer was the layer provided directly under the outermost layer. The composite member of sample No. 102 was made similarly to sample No. 7 except for a difference in thickness of the second layer. In the composite member of sample No. 102, the third layer was the outermost layer. In the composite member of sample No. 102, the second layer was the layer provided directly under the outermost layer. Furthermore, in the composite member of sample No. 102, the first layer was the layer provided directly under the second layer.

[Sample No. 103]

The composite member of sample No. 103 was made by forming a coating layer in the two-layered structure including the first layer and the second layer directly on the substrate sequentially from the side of the substrate. In other words, the second layer was the outermost layer. The first layer was the layer provided directly under the outermost layer. The first layer was formed from a layer composed substantially of Zr. The first layer was formed by chemical treatment. The second layer was formed from an Ni—P plated layer composed substantially only of Ni and P similarly to the second layer of sample No. 1.

[Sample No. 104]

The composite member of sample No. 104 was made by forming a coating layer formed only from the first layer directly on the substrate. The first layer was formed from an Ni—P plated layer composed substantially only of Ni and P similarly to the second layer of sample No. 1.

[Sample No. 105]

The composite member of sample No. 105 was made by forming a coating layer in the two-layered structure including the first layer and the second layer directly on the substrate sequentially from the side of the substrate. In other words, the second layer was the outermost layer. The first layer was the layer provided directly under the outermost layer. The first layer was formed from an Ni—P plated layer composed substantially only of Ni and P, similarly to the second layer of sample No. 1. The second layer was formed from an Ni plated layer. The second layer was formed by electroplating.

[Samples Nos. 106 to 110]

The composite member of each of samples Nos. 106 to 110 was made by forming a coating layer in the three-layered structure including the first layer, the second layer, and the third layer directly on the substrate sequentially from the side of the substrate. In other words, the third layer was the outermost layer. The second layer was the layer provided directly under the outermost layer. The first layer was the layer provided directly under the second layer. The first layer was formed from an Ni—P plated layer composed substantially only of Ni and P, similarly to the second layer of sample No. 1. The second layer was formed from a Cu plated layer composed substantially only of Cu, similarly to the first layer of sample No. 1 or the like. The third layer was formed from an Ni plated layer, similarly to the second layer of sample No. 105.

[Measurement of Thickness]

A thickness of each layer was found as below. A cross-section in a thickness direction of each sample was obtained by subjecting the sample to a cross-section polisher (CP) process. In this cross-section, at least ten fields of view for observation with a scanning electron microscope were taken. A magnification in each field of view and a size of each field of view were set to cover the entire area in the thickness direction of each layer within the same field of view. In each field of view for observation, a length of each layer along the thickness direction was measured at at least ten locations. An average value of all measured lengths was calculated for each layer. Each average value was defined as the thickness of each layer. Table 1 shows the thickness of each layer.

[Evaluation of Corrosion Resistance]

Corrosion resistance was evaluated by conducting salt spraying testing in conformity with JIS Z 2371 (2015) to examine time of occurrence of pitting and a corroded state after lapse of 168 hours (hr). In the salt spraying testing, a sodium chloride aqueous solution at a concentration of five mass percent was employed. A temperature in the testing was set to 35° C. A time period for the testing was set to 168 hours.

The samples were visually checked for pitting. This checking was done every 24 hours from start of the testing until lapse of 168 hours. Table 1 shows results. "-" in the field of time of start of pitting in Table 1 means that pitting did not occur.

The corroded state of each sample after lapse of 168 hours was visually checked. The state after lapse of 168 hours was evaluated in three levels of "A", "B", and "C". A sample where pitting did not occur was evaluated as "A", a sample where pitting occurred was evaluated as "B", and a sample that did not maintain its shape was evaluated as "C". The sample not maintaining its shape means that there were no four corners of the substrate or that the entire surface of the composite member was covered with a product resulting from corrosion. When the entire surface of the composite member was covered with the product resulting from corrosion, the substrate itself was corroded. Table 1 shows results.

[Measurement of Coefficient of Thermal Expansion and Thermal Conductivity]

The coefficient of thermal expansion and thermal conductivity were measured by cutting a test piece for measurement from each sample and using a commercially available measurement instrument (TMA 4000SE manufactured by NETZSCH Japan K.K.). Thermal conductivity was measured at a room temperature (around 20° C.). The coefficient of thermal expansion was calculated as an average value in measurement within a range from 30° C. to 120° C. Table 1 shows results.

TABLE 1

| Sample No. | Coating Layer | | | | | | Corrosion Resistance | | Coefficient of Thermal Expansion (ppm/K) | Thermal Conductivity (W/mK) |
|---|---|---|---|---|---|---|---|---|---|---|
| | First Layer | | Second Layer | | Third Layer | | Time of Start of Pitting (hr) | State After 168 hrs. | | |
| | Composition | Thickness (μm) | Composition | Thickness (μm) | Composition | Thickness (μm) | | | | |
| 1 | Cu | 30 | Ni-P | 3 | — | — | — | A | 7.5 | 230 |
| 2 | Cu | 50 | Ni-P | 3 | — | — | — | A | 7.5 | 230 |
| 3 | Cu | 150 | Ni-P | 3 | — | — | — | A | 7.6 | 240 |
| 4 | Cu | 240 | Ni-P | 3 | — | — | — | A | 7.8 | 245 |
| 5 | Cu | 50 | Ni-P | 3 | — | — | — | A | 7.5 | 230 |
| 6 | Cu | 50 | Ni-P | 3 | — | — | — | A | 7.5 | 230 |
| 7 | Ni-P | 12 | Cu | 30 | Ni-P | 3 | — | A | 7.5 | 230 |
| 8 | Ni-P | 12 | Cu | 50 | Ni-P | 3 | — | A | 7.5 | 220 |
| 9 | Ni-P | 12 | Cu | 80 | Ni-P | 3 | — | A | 7.5 | 230 |
| 10 | Ni-P | 12 | Cu | 150 | Ni-P | 3 | — | A | 7.5 | 240 |
| 101 | Cu | 25 | Ni-P | 3 | — | — | 72 | B | 7.5 | 230 |
| 102 | Ni-P | 12 | Cu | 25 | Ni-P | 3 | 72 | B | 7.5 | 220 |
| 103 | Zr | 0.1 | Ni-P | 12 | — | — | 24 | C | 7.5 | 220 |
| 104 | Ni-P | 50 | — | — | — | — | 24 | C | 7.5 | 210 |
| 105 | Ni-P | 12 | Ni | 50 | — | — | 72 | B | 7.5 | 210 |
| 106 | Ni-P | 12 | Cu | 25 | Ni | 3 | 72 | B | 7.5 | 220 |
| 107 | Ni-P | 12 | Cu | 30 | Ni | 3 | 72 | B | 7.5 | 220 |
| 108 | Ni-P | 12 | Cu | 50 | Ni | 3 | 72 | B | 7.5 | 230 |
| 109 | Ni-P | 12 | Cu | 100 | Ni | 3 | 96 | B | 7.5 | 230 |
| 110 | Ni-P | 12 | Cu | 150 | Ni | 3 | 96 | B | 7.6 | 240 |

As shown in Table 1, pitting did not occur in the composite member in each of samples Nos. 1 to 10 after lapse of 168 hours since start of the salt spraying testing. The composite member in each of samples Nos. 1 to 3 and 5 to 10 had coefficients of thermal expansion of 7.5 ppm/K and 7.6 ppm/K. In contrast, the composite member of sample No. 4 had a coefficient of thermal expansion of 7.8 ppm/K which was higher than those of sample No. 1 and the like. The composite member of each of samples Nos. 1 to 10 had thermal conductivity not lower than 220 W/m·K. The composite member of each of samples Nos. 1 to 10 tended to be higher in thermal conductivity as the Cu layer (the first layer in samples Nos. 1 to 6 and the second layer in samples Nos. 7 to 10) composed substantially of Cu was larger in thickness.

In contrast, pitting occurred in the composite member of each of samples Nos. 101 to 110 by the time of lapse of 96 hours since start of the salt spraying testing. In particular, the composite member of each of samples Nos. 103 and 104 failed to maintain its shape after lapse of 168 hours since start of the salt spraying testing.

Though the embodiments and Example of the present disclosure have been described as above, combination of features in each embodiment and Example described above as appropriate or various modifications thereof is/are also originally intended.

It should be understood that the embodiments and Example disclosed herein are illustrative and non-restrictive in every respect. The scope of the present invention is defined by the terms of the claims rather than the embodiments and Example above and is intended to include any modifications within the scope and meaning equivalent to the terms of the claims.

REFERENCE SIGNS LIST 1 composite member; 2 substrate; 20 metal; 22 non-metal; 3 coating layer; 30 inner layer; 31 intermediate layer; 32 outermost layer

The invention claimed is:

1. A composite member comprising:
 a substrate composed of a composite material containing pure magnesium and SiC, or a magnesium alloy and SiC; and
 a coating layer provided on a surface of the substrate, wherein
 the coating layer includes
  an outermost layer provided as an outermost surface, and
  an intermediate layer provided directly under the outermost layer,
 the outermost layer contains nickel and phosphorus,
 the intermediate layer is mainly composed of copper,
 the intermediate layer has a thickness not smaller than 30 µm, and
 the outermost layer contains an amount of phosphorus not lower than 1 mass % and not higher than 6 mass % of the outermost layer.

2. The composite member according to claim 1, wherein
 the coating layer includes an inner layer provided directly under the intermediate layer, and
 the inner layer contains nickel and phosphorus.

3. The composite member according to claim 1, wherein
 the intermediate layer has a thickness not smaller than 30 µm and not larger than 200 µm.

4. A heat radiation member comprising the composite member according to claim 1.

5. A composite member comprising:
 a substrate composed of a composite material containing pure magnesium and SiC, or a magnesium alloy and SiC; and
 a coating layer provided on a surface of the substrate, wherein
 the coating layer includes
  an outermost layer provided as an outermost surface, and
  an intermediate layer provided directly under the outermost layer,
 the outermost layer contains nickel and phosphorus,
 the intermediate layer is mainly composed of copper,
 the intermediate layer has a thickness not smaller than 30 µm,
 the intermediate layer is in contact with the surface of the substrate, and
 the outermost layer contains an amount of phosphorus not lower than 1 mass % and not higher than 6 mass % of the outermost layer.

6. The composite member according to claim 5, wherein
 the intermediate layer has a thickness not smaller than 30 µm and not larger than 200 µm.

7. A heat radiation member comprising the composite member according to claim 5.

* * * * *